United States Patent [19]

Inagawa et al.

[11] Patent Number: 5,475,278
[45] Date of Patent: Dec. 12, 1995

[54] METHOD FOR DRIVING PIEZOELECTRIC ACTUATOR

[75] Inventors: Masako Inagawa; Sadayuki Takahashi; Koichi Morimoto; Satoru Tagami, all of Tokyo, Japan

[73] Assignee: NEC Corporation, Tokyo, Japan

[21] Appl. No.: 219,698

[22] Filed: Mar. 30, 1994

Related U.S. Application Data

[63] Continuation of Ser. No. 868,698, Apr. 15, 1992, abandoned.

[30] Foreign Application Priority Data

Apr. 15, 1991 [JP] Japan ................................. 3-082133

[51] Int. Cl.$^6$ ........................................ H01L 41/08
[52] U.S. Cl. ..................... 310/317; 310/315; 310/343
[58] Field of Search ..................... 310/315–317, 310/340, 343, 311; 318/116

[56] References Cited

U.S. PATENT DOCUMENTS

| | | | |
|---|---|---|---|
| 1,875,953 | 9/1932 | Taylor | 310/341 |
| 2,607,858 | 8/1952 | Mason | 310/358 X |
| 2,969,512 | 1/1961 | Jaffe et al. | 310/358 X |
| 3,474,268 | 10/1969 | Rudaick | 310/317 |
| 3,902,083 | 8/1975 | Zoltan | 310/317 |
| 3,902,084 | 8/1975 | May, Jr. | 310/328 X |
| 4,047,992 | 9/1977 | Williams | 310/37 |
| 4,099,211 | 7/1978 | Hathaway | 310/317 X |
| 4,314,174 | 2/1982 | Wing et al. | 310/315 |
| 4,318,062 | 3/1982 | Mitsui et al. | 310/317 |
| 4,553,059 | 11/1985 | Abe et al. | 310/341 X |
| 4,554,477 | 11/1985 | Ratcliff | 310/316 |
| 4,583,059 | 4/1986 | Konno | 310/315 X |
| 4,632,311 | 12/1986 | Nakane et al. | 310/316 X |
| 5,225,734 | 7/1993 | Nakanishi | 310/341 X |
| 5,239,518 | 8/1993 | Kazmar | 310/343 X |

FOREIGN PATENT DOCUMENTS

| | | |
|---|---|---|
| 0094078 | 11/1983 | European Pat. Off. . |
| 61-152086 | 7/1986 | Japan . |
| 2038776 | 2/1990 | Japan . |
| 3073359 | 3/1991 | Japan . |

OTHER PUBLICATIONS

Patent Abstracts of Japan, vol. 10, No. 352 (E–458) 27 Nov. 1986; JP-A–61 152 086.
Patent Abstracts of Japan, vol. 14, No. 198 (M965) 23 Apr. 1990; JP-A–2 038 776.
Patent Abstracts of Japan, vol. 15, No. 235 (M–1125) 17 Jun. 1991; JP-A–3 073 359.
European Search Report.

*Primary Examiner*—Mark O. Budd
*Attorney, Agent, or Firm*—Sughrue, Mion, Zinn, Macpeak & Seas

[57] ABSTRACT

A piezoelectric actuator is driven by continuously applying a pulse voltage or an AC voltage to a piezoelectric element, so as to cause the piezoelectric element to generate heat because of a dielectric loss of the piezoelectric element itself. If the temperature of the piezoelectric element reaches a temperature not less than 15° C., moisture contained in atmosphere is effectively prevented from entering into a resin casing of the piezoelectric actuator enclosing therein the piezoelectric element. Otherwise, moisture condensation or sweating would occur on a surface of the piezoelectric element. Therefore, even if the piezoelectric actuator is used in atmosphere of high humidity, a discharge breakdown will not occur, and reliability is remarkably increased.

4 Claims, 5 Drawing Sheets

METHOD FOR DRIVING PIEZOELECTRIC ACTUATOR

This is a continuation of application No. 07/868,698, filed Apr. 15, 1992, now abandoned.

BACKGROUND OF THE INVENTION

1. Field of the Invention

The present invention relates to a method for driving a piezoelectric actuator which is foraged of a piezoelectric effect element.

2. Description of Related Art

One typical piezoelectric actuator, called a "multilayer piezoelectric ceramic actuator", includes a piezoelectric effect element formed by stacking a number of thin sheets of piezoelectric material in a displacement direction, so that a large amount of displacement can be obtained with a low driving voltage. An internal electrode is interposed between each pair of adjacent piezoelectric material sheets, and the internal electrodes are interconnected every other one, so that all the internal electrodes are divided into two groups. The stacked piezoelectric material sheets are encapsulated with a resin casing in such a manner that opposite end surfaces of a stacked body of piezoelectric material sheets are exposed but a side surface of the stacked body is completely covered by the resin casing.

If the above mentioned piezoelectric actuator is used an atmosphere of high humidity, moisture contained in the atmosphere gradually enters the resin casing over a period of time, and ultimately, reaches the surface of the stacked body of piezoelectric material sheets so that moisture condensation or sweating occurs on the surface of the stacked body in the inside of the resin casing.

For example, each of the piezoelectric material sheets has a thickness of about 100 μm, and a voltage of 150 V is applied between two groups of internal electrodes. Namely, 150 V is applied across each piezoelectric material sheet. This means that an intense electric field of 150000 V/cm is applied. Due to this intense electric field and the moisture condensation or sweating on the surface of the stacked body, an electric discharge will occur between the internal electrodes or between the internal electrode and an internal wiring formed between the side surface of the stacked body and the resin casing. As a result, the piezoelectric actuator breaks down or destroyed.

SUMMARY OF THE INVENTION

Accordingly, it is an object of the present invention to provide a piezoelectric actuator driving method which overcomes the above mentioned defect inherent in conventional actuators.

Another object of the present invention is to provide a piezoelectric actuator driving method capable of preventing a discharge breakdown due to the internal moisture condensation or sweating, even if the piezoelectric actuator is used in a high humidity atmosphere with a maximum rated voltage for a long time.

The above and other objects of the present invention are achieved in accordance with the present invention by a method for driving a piezoelectric actuator including a piezoelectric element, by applying the piezoelectric element with an electric voltage including a ceaselessly varying component, so as to cause the piezoelectric element to generate heat because of a dielectric loss of the piezoelectric element itself, whereby moisture is prevented from entering into the inside of the piezoelectric actuator.

The above and other objects, features and advantages of the present invention will be apparent from the following description of preferred embodiments of the invention with reference to the accompanying drawings.

DESCRIPTION OF THE PREFERRED EMBODIMENTS

Figure 1:
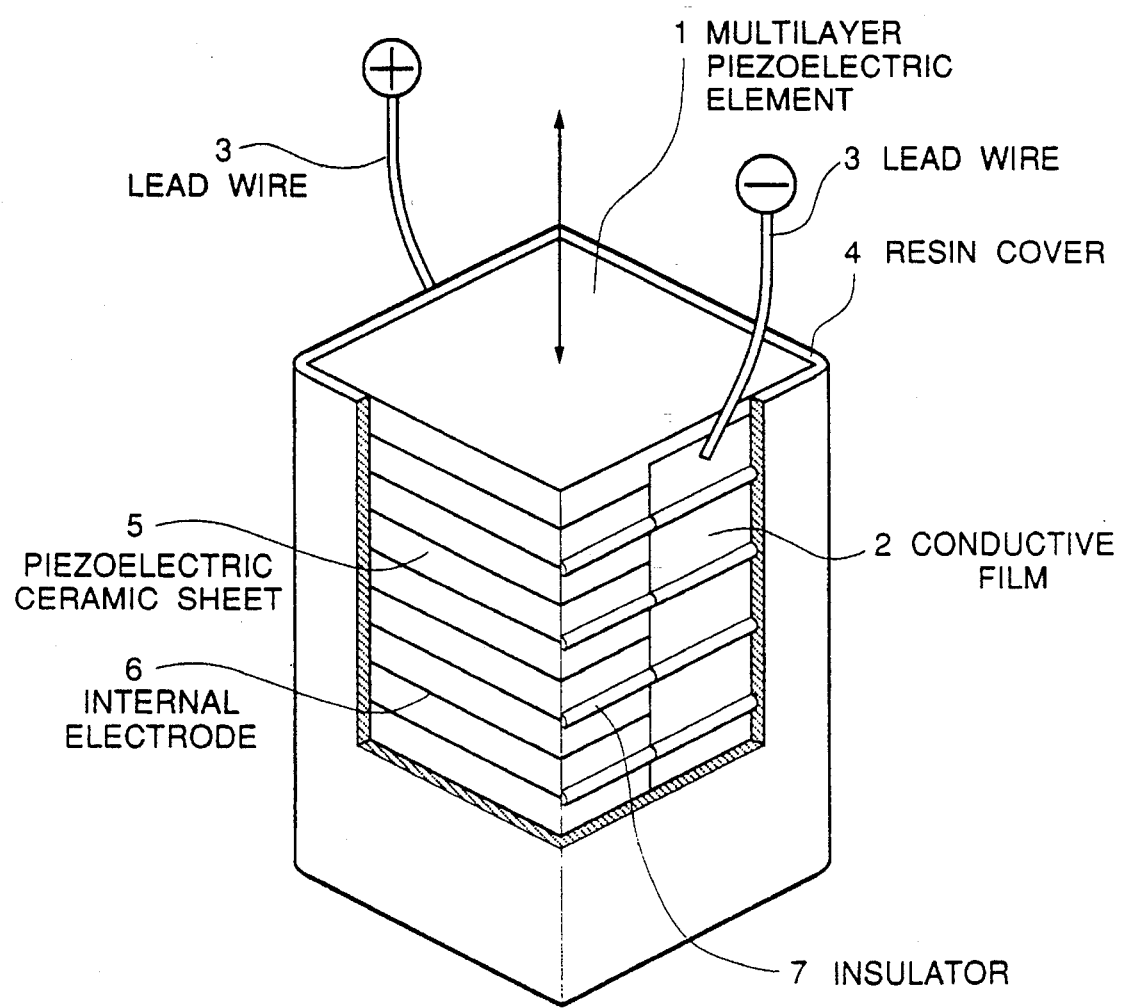
FIG. 1 is a partially broken, diagrammatic perspective view of one example of a multilayer piezoelectric ceramic actuator which can be driven by the driving method in accordance with the present invention.

Referring to FIG. 1, there is shown a partially broken, diagrammatic perspective view of one example of a multilayer piezoelectric ceramic actuator which can be driven by the driving method in accordance with the present invention.

The shown multilayer piezoelectric ceramic actuator includes a multilayer piezoelectric element 1 formed by stacking a number of thin sheets 5 of piezoelectric ceramic material in a displacement direction shown by an arrow in FIG. 1, so that a large amount of displacement can be obtained with a low driving voltage. An internal electrode 6 is interposed between each pail of adjacent piezoelectric material sheets 5.

The multilayer piezoelectric element 1 can be formed by alternately stacking the piezoelectric material sheets 5 and the internal electrodes 6 in such a manner that one internal electrode 6 is interposed between each pair of adjacent piezoelectric material sheets 5 and one piezoelectric material sheet 5 is interposed between each pair of adjacent internal electrodes 6, and then, sintering the stacked body so that the stacked piezoelectric material sheets 5 and internal electrodes 6 become integral with one another.

In addition, at one side surface (for example, a right-hand front side surface in FIG. 1) of the multilayer piezoelectric element 1, exposed portions of the internal electrodes 6 are covered or coated by an insulator 7, every other one, and the right-hand front side surface of the multilayer piezoelectric element 1 is covered by a conductive film 2, so that the exposed portions of the internal electrodes 6 which are not covered by the insulator 7 are interconnected by the conductive film 2. Similarly, at an opposite side surface (for example, a left-hand rear side surface not directly visible in FIG. 1) of the multilayer piezoelectric element 1, exposed portions of the internal electrodes 6 which are interconnected by the conductive film 2 at the right-hand front side surface in FIG. 1, are covered or coated by an insulator (not shown), every other one, and the opposite side surface of the multilayer piezoelectric element 1 is covered by a conductive film (not shown), so that the exposed portions of the internal electrodes 6 which are not connected to the conductive film 2 at the right-hand front side surface in FIG. 1, are interconnected by the conductive film (not shown) at the left-hand rear side surface of the multilayer piezoelectric element 1. Thus, the internal electrodes 6 are interconnected every other one, so that all the internal electrodes are divided into two groups.

A pair of lead wires 3 are soldered to the conductive film 2 at the right-hand front side surface of the multilayer piezoelectric element 1 and the conductive film (not shown) at the left-hand rear side surface (not shown) of the multilayer piezoelectric element 1, respectively.

As seen from FIG. 1, the multilayer piezoelectric element 1 is in the form of a square column, and four side surfaces of the multilayer piezoelectric element 1 are completely covered by a resin cover 4. Upper and bottom end surfaces of the multilayer piezoelectric element 1 which are not covered by the resin cover 4 constitute a reference surface and a displacement surface of displacement, respectively.

For example, the piezoelectric ceramic sheets 5 are formed of a ceramic thin film made of lead titanate zirconate and having a thickness of about 100 μm. The internal electrodes and the conductive film 2 are formed of a conductive paste made of a silver-palladium alloy. The insulator 7; is formed by depositing powdered glass on predetermined portions of the multilayer piezoelectric element 1 by an electrophoretic method, and then, sintering the deposited powdered glass. The resin cover 4 is formed of epoxy insulative resin.

Furthermore, for example, the multilayer piezoelectric element 1 has a cross-section of 5 mm×5 mm perpendicularly to the displacement direction, and a height or length of 10 mm. In use, a voltage of 150 V at maximum is applied as the driving voltage. In this condition, the total displacement of about 10 μm can be obtained in the displacement direction.

If the above mentioned multilayer piezoelectric ceramic actuator is driven with a DC voltage of 150 V under an accelerated test condition of a temperature of 40° C. and a relative humidity of 90% to 95%, failure begins to occur after a few hours.

In one embodiment of the piezoelectric actuator driving method in accordance with the present invention, on the other hand, a pulse voltage having an amplitude of 150 V, a pulse width of 0.15 μm and a repetition frequency of 500 Hz is continuously applied between the pair of lead wires 3 of the above mentioned multilayer piezoelectric ceramic actuator. A circuit for outputting a modulated rectangular wave is illustrated, e.g., in FIG. 5.22 of *Applications of Operational Amplifiers,* Jerald G. Graeme, McGraw-Hill Book Co., New York 1973.

In order to verify a lift extension effect of the above mentioned embodiment of the piezoelectric actuator driving method in accordance with the present invention, a reliability test was conducted under an accelerated lift test condition of a temperature of 40° C. and a relative humidity of 90% to 95%. A mean lift time was firstly obtained by plotting an accumulated failure rate on a probability sheet, every hour, and then, MTYF (mean time to failure) in an actual using condition was estimated from the obtained mean lift time by taking an acceleration rate into consideration.

Figure 2:
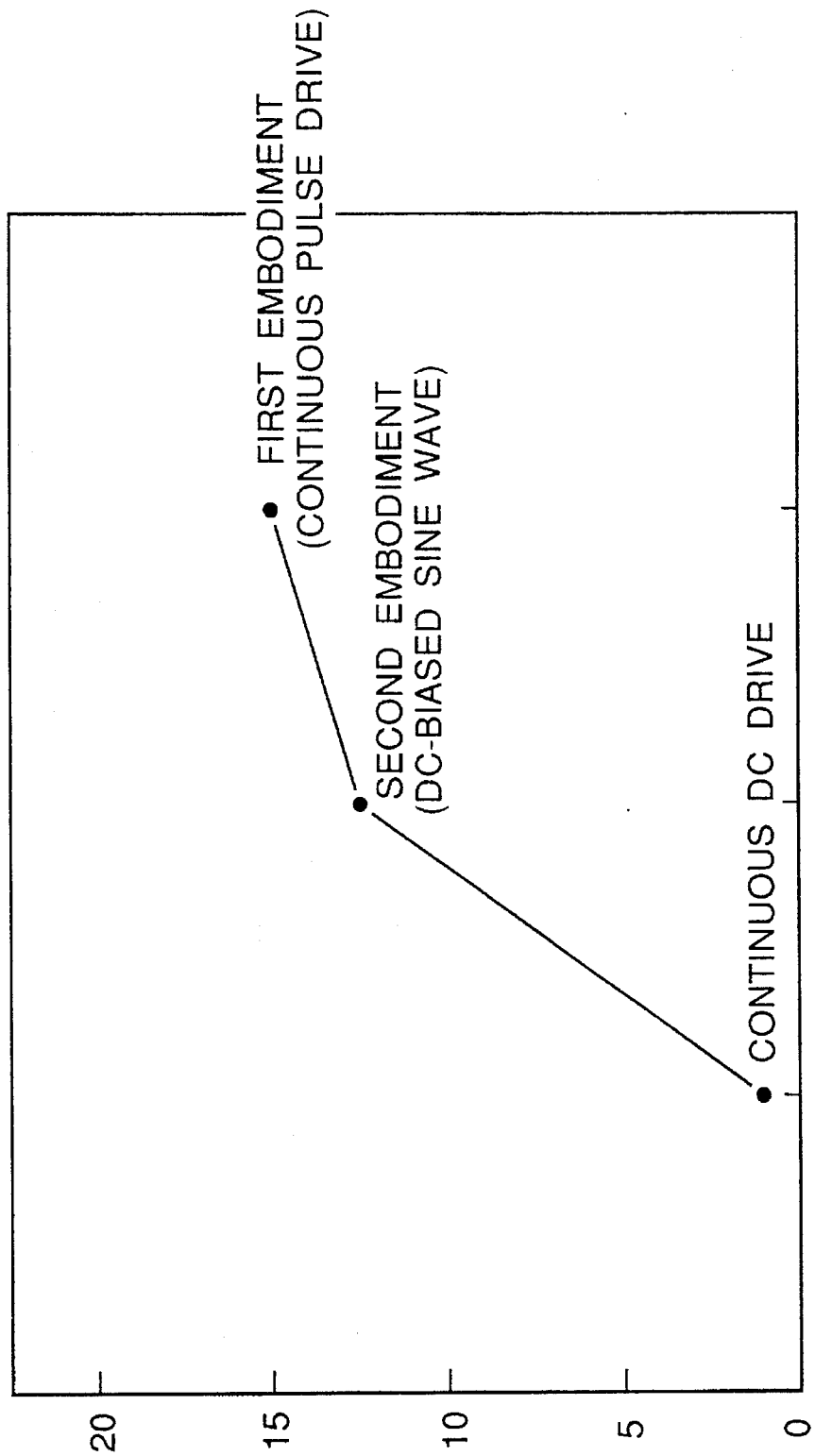
FIG. 2 is a graph showing the result of the accelerated life time ratio test under moisture atmosphere in different driving methods of the piezoelectric ceramic actuator.

The graph of FIG. 2 shows the result of the reliability test. The ordinate axis indicates a MTTF ratio in which the mean lift time in case of continuously applying a DC 150 V is deemed as 1 (one). FIG. 2 shows that the piezoelectric actuator driving method of the first embodiment can extend the mean lift time of the piezoelectric actuator to a length which is about fifteen times the mean lift time in case of continuously applying the DC 150 V.

This effect can be interpreted to be attributable to the following: By continuously applying the pulses to the piezoelectric element 1, the piezoelectric element I generates heat due to dielectric and other losses, so that the temperature of the piezoelectric element 1 becomes higher than the temperature of the atmosphere. As a result, moisture contained in the atmosphere is prevented from entering the resin cover 4.

Figure 3:
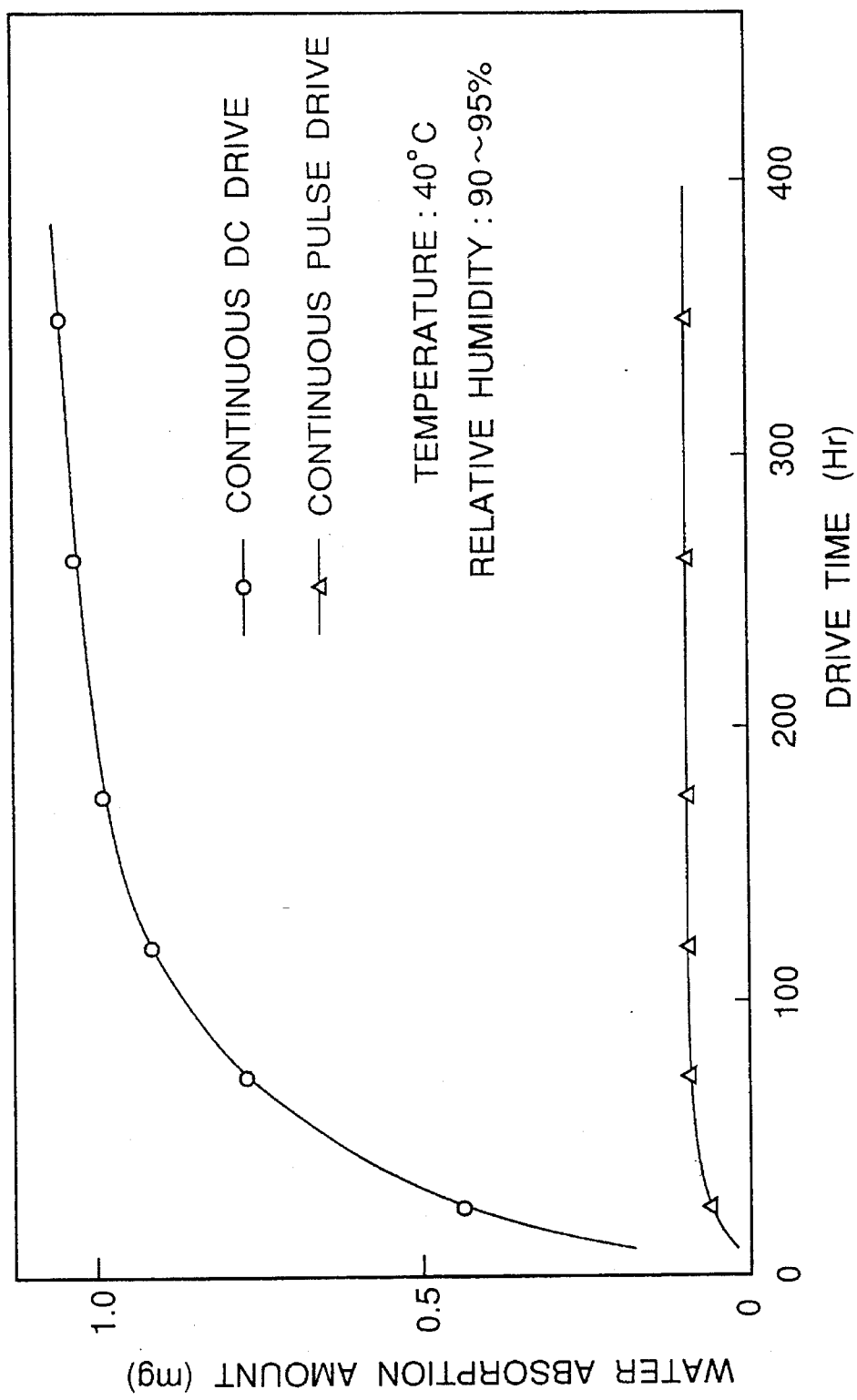
FIG. 3 is a graph showing a change in time of a water absorption amount of the piezoelectric ceramic actuator in different driving methods of the piezoelectric ceramic actuator.

For confirming this interpretation, the water absorption amount of the piezoelectric element 1 (the amount of moisture condensation or sweating on a surface of the piezoelectric element) was measured. The result is shown in FIG. 3, which illustrates the change in time of the water absorption amount in a first case of continuously applying the DC 150 V under the above mentioned atmospheric conditions and in a second case of continuously applying the above mentioned pulses under the above mentioned atmospheric conditions. The water absorption amount in the pulse drive case is about one-tenth of that of the water absorption amount in the case of the continuous application of DC voltage, and the change in time of the water absorption amount is smaller in the pulse drive case than in the case of the continuous application of DC voltage. It would be understood from these facts that the difference in the water absorption amount results in the difference in the lift time.

Figure 4:
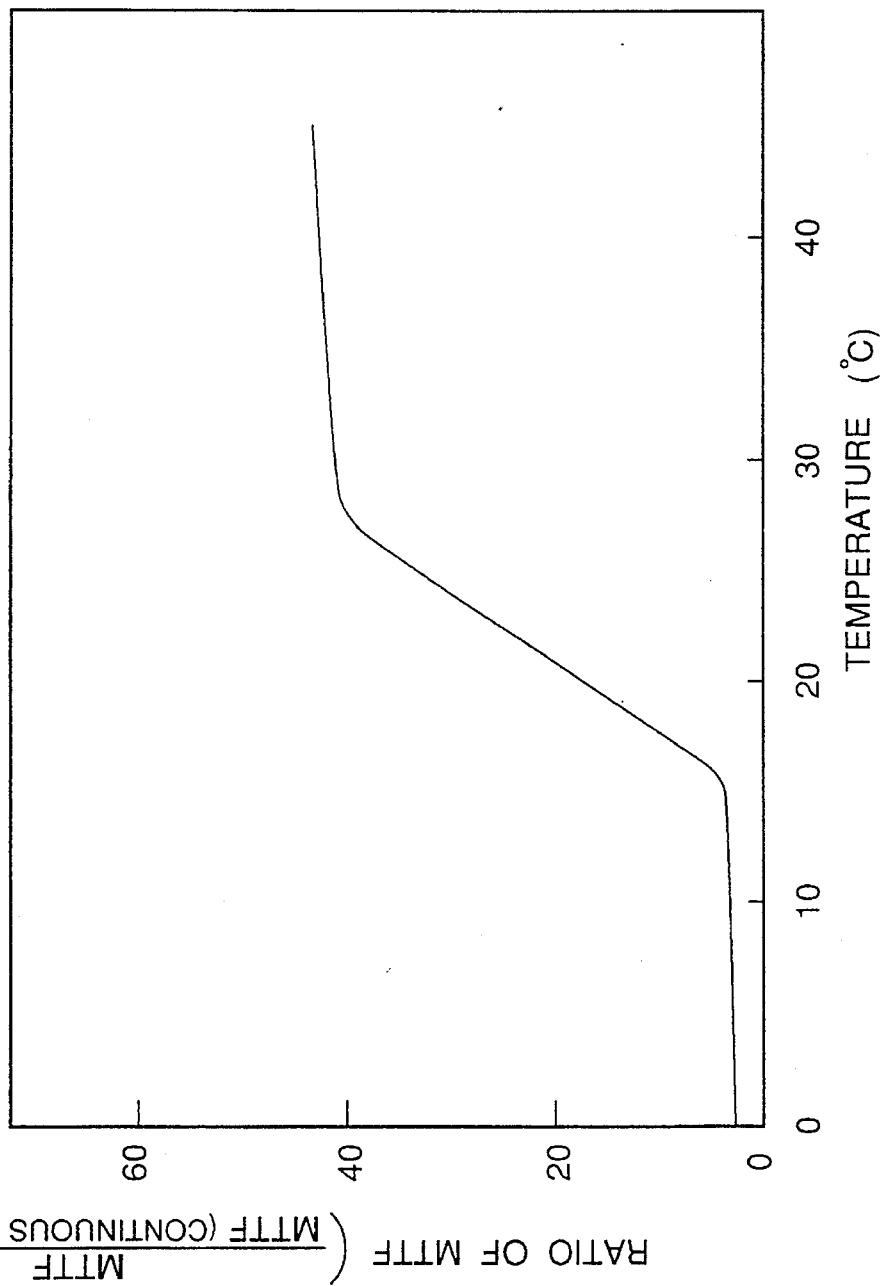
FIG. 4 is a graph showing the relation between the accelerated life time ratio and the temperature of the piezoelectric ceramic actuator.

Referring to FIG. 4, a relation is shown between the temperature and the accelerated lift time ratio of the piezoelectric element 1. It would be understood from FIG. 4 that if the temperature of the piezoelectric element 1 becomes not less than 15° C., the lift time extension effect is very remarkably increased, and if the temperature of the piezoelectric element 1 becomes not less than 30° C., the lift time becomes about forty times that of the DC driving case. Incidentally, a remarkable effect of lift time extension cannot be found at a temperature less than 15° C. The mason for this is considered that the difference in temperature between the piezoelectric element I and the atmosphere is small, and therefore, is not sufficient to prevent, by action of the generated heat, moisture from entering the inside of the piezoelectric actuator.

Now, on a second embodiment of the piezoelectric actuator driving method in accordance with the present invention will be described. In this second embodiment, the piezoelectric actuator is driven with a sine wave voltage superimposed with a DC bias voltage, for the purpose of causing the piezoelectric element 1 to generate heat. The DC bias voltage is set to be larger than a coercive electric field of the piezoelectric element, in order to certainly prevent inversion of polarization of the piezoelectric element 1. A circuit for outputting a high frequency ripple current biased with a DC voltage is illustrated, e.g., in FIGS. 2–3 of "High Frequency Constant Current Power Supply" (Catalog of Takasago, Ltd., Japan), HFS 100K-100, HFS 300K-100, and HFS 500K-100.

Figure 5:
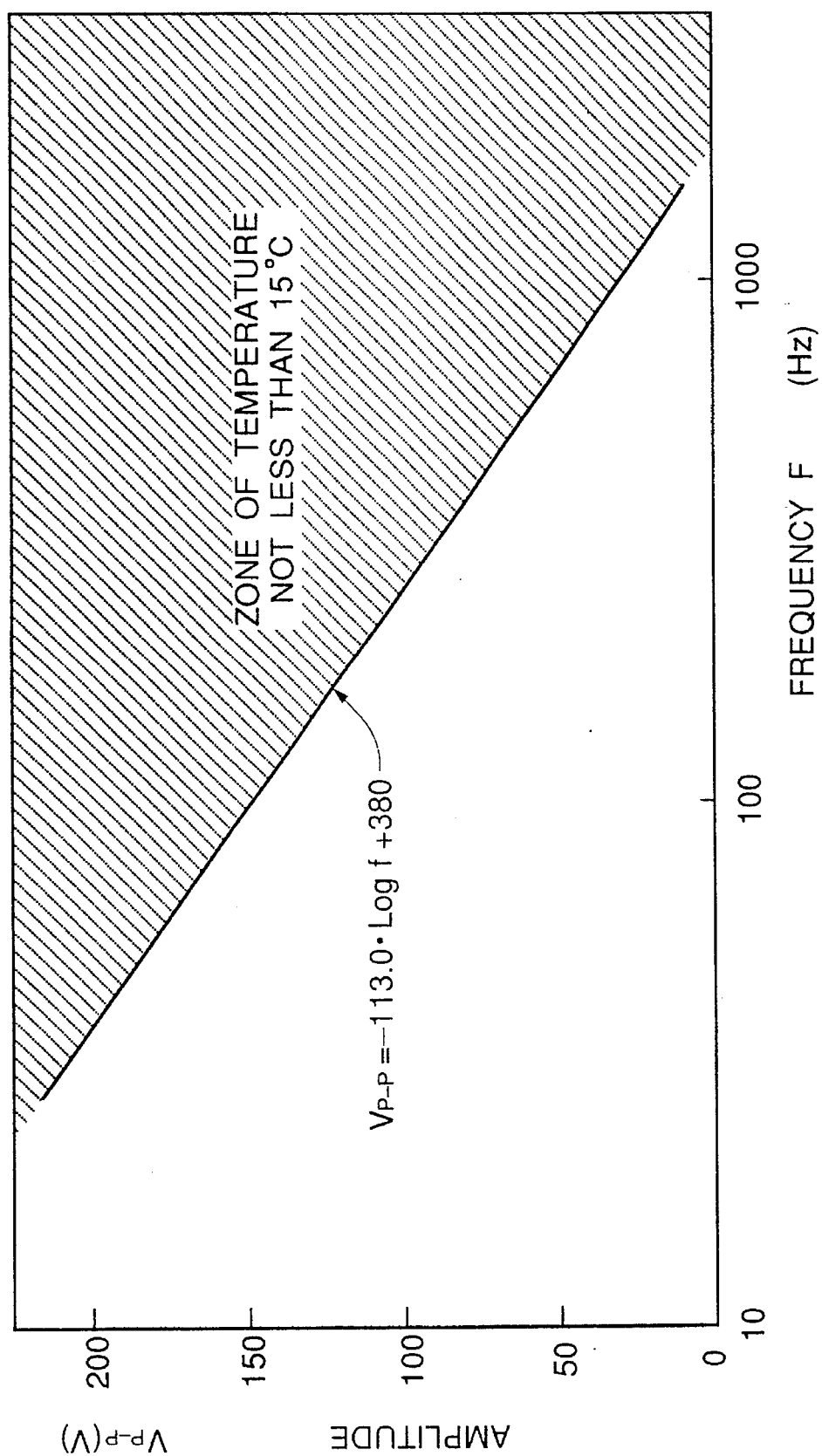
FIG. 5 is a graph showing the relation between the driving condition and the temperature in a second embodiment of the piezoelectric actuator driving method in accordance with the present invention.

The amplitude and the frequency of the sine wave voltage to be superimposed on the DC bias voltage are determined with reference to FIG. 5, which shows the relation between the temperature of the piezoelectric element and the amplitude and the frequency of the sine wave voltage. In FIG. 5, the of abscissa shows the frequency f $f$ (Hz), and the ordinate shows the amplitude (peak-to-peak voltage) Vp-p (V). In addition, hatching shows a zone in which the temperature of the piezoelectric element becomes not less than 15° C.

The driving condition for ensuring that the piezoelectric element becomes not less than 15° C. can be derived from FIG. 5. This driving condition can be expressed:

$$\text{Vp-p} \geq -113.0 \cdot \log f + 380$$

Accordingly, if the piezoelectric actuator is driven so as to fulfil the above condition, a lift extension effect similar to that of the first embodiment can be expected. As one example, when the piezoelectric actuator is driven with a sine wave voltage of the amplitude Vp-p of 100 V and the frequency $f$ of 300 Hz, superimposed with a DC bias voltage of 50 V, the temperature of the piezoelectric element was 18° C.

The lift time extension effect in the case of driving the piezoelectric actuator under this condition is shown in FIG. 2. The piezoelectric actuator driving method of the second embodiment can extend the mean lift time of the piezoelectric actuator to a length which is about thirteen times the mean lift time of the continuous DC drive.

Next, a third embodiment of the piezoelectric actuator driving method will be described. In the third embodiment, the piezoelectric actuator is continuously driven with an AC voltage so as to cause the piezoelectric element to generate heat. In this case, a voltage is applied in a direction opposite to a previously polarized direction, differently from the first and second embodiments. Since the piezoelectric element is formed of a ferroelectric material, if a reversed voltage larger than a coercive electric field is applied, the polarization direction is inverted. In the driving method accompanying with the inversion of the polarization, therefore, a hysteresis loss including the dielectric loss is large. Accordingly, if the piezoelectric actuator is continuously driven with an AC voltage, the heat generation of the piezoelectric element is very large.

In the third embodiment, for example, the piezoelectric actuator was driven with an AC voltage of the amplitude Vp-p of 140 V and the frequency $f$ of 50 Hz. In this case, the temperature of the piezoelectric element was 90° C. In addition, the lift time extension effect can be confirmed.

In the first to third embodiments, the piezoelectric actuator was driven with the rectangular or sine wave voltage (pulse voltage or AC voltage). However, the piezoelectric actuator driving method of the present invention is in no way limited to these voltage waveforms. If it is possible to cause the piezoelectric actuator to generate heat, any voltage waveform including a triangular wave or a sawtooth wave can be used, and a similar effect can be obtained.

The invention has thus been shown and described with reference to the specific embodiments. However, it should be noted that the present, invention is in no way limited to the details of the illustrated structures but changes and modifications may be made within the scope of the appended claims.

We claim:

1. A method for driving a piezoelectric actuator including a piezoelectric element, comprising: applying to said piezoelectric element an electric voltage including a continuously varying component, so as to cause said piezoelectric element to generate heat due to a dielectric loss of said piezoelectric element, wherein said piezoelectric actuator is driven by applying an AC voltage superimposed on a DC voltage larger than a coercive electric field of said piezoelectric element, so as to cause said piezoelectric element to heat to a temperature not less than 15° C., and wherein said AC voltage has a peak-to-peak voltage value Vp-p (V) and a frequency f (Hz) expressed as follows:

$$\text{Vp-p} \geq 113.0 \cdot \log f + 380.$$

2. A method for driving a piezoelectric actuator including a multilayer piezoelectric element, comprising: applying to said piezoelectric element an AC voltage superimposed on a DC voltage larger than a coercive electric field of said piezoelectric element, so as to cause said piezoelectric element to heat to a temperature not less than 15° C., wherein said AC voltage has a peak-to-peak voltage value Vp-p (V) and a frequency I (Hz) expressed as follows:

$$\text{Vp-p} = -113.0 \cdot \log f + 380.$$

3. A method as claimed in claim 1, whereby moisture is prevented from entering into said piezoelectric actuator.

4. A method as claimed in claim 2 whereby moisture is prevented from entering into said piezoelectric actuator.

\* \* \* \* \*

UNITED STATES PATENT AND TRADEMARK OFFICE
CERTIFICATE OF CORRECTION

PATENT NO. : 5,475,278
DATED : December 12, 1995
INVENTOR(S) : Masako INAGAWA, Sadayuki TAKAHASHI, Koichi MORIMOTO, Satoru TAGAMI It is certified that error(s) appears in the above-identified patent and that said Letters Patent is hereby corrected as shown below:

Col. 1, line 46, after "or", insert --is--.

Col. 2, line 42, delete "pail", insert --pair--.

Col. 4, line 41, delete "mason", insert --reason--.

Col. 4, line 67, delete "f".

Col. 6, line 28, delete "$\geq 113.0$", insert --$\geq$-113.0--.

Col. 6, line 38, delete "I", insert --f--.

Signed and Sealed this

Eighteenth Day of June, 1996

Attest:

BRUCE LEHMAN

Attesting Officer     Commissioner of Patents and Trademarks